United States Patent
Baba et al.

[11] Patent Number: 6,071,755
[45] Date of Patent: Jun. 6, 2000

[54] METHOD OF MANUFACTURING SEMICONDUCTOR DEVICE

[75] Inventors: Shinji Baba; Jun Shibata; Tetsuya Ueda, all of Tokyo, Japan

[73] Assignee: Mitsubushi Denki Kabushiki Kaisha, Tokyo, Japan

[21] Appl. No.: 09/360,484

[22] Filed: Jul. 23, 1999

Related U.S. Application Data

[62] Division of application No. 08/571,604, Dec. 13, 1995, Pat. No. 5,969,426.

[30] Foreign Application Priority Data

Dec. 14, 1994 [JP] Japan ................................. 6-310643

[51] Int. Cl.[7] ........................... H01L 21/44; H01L 21/48; H01L 21/50
[52] U.S. Cl. .......................... 438/106; 438/118; 438/123; 438/127
[58] Field of Search .................................. 438/106, 118, 438/123, 127

[56] References Cited

U.S. PATENT DOCUMENTS

| | | | |
|---|---|---|---|
| 5,285,352 | 2/1994 | Pastore et al. | 361/707 |
| 5,313,365 | 5/1994 | Pennisi et al. | |
| 5,355,283 | 10/1994 | Marrs et al. | 361/760 |
| 5,371,404 | 12/1994 | Juskey et al. | 257/659 |
| 5,394,009 | 2/1995 | Loo | 257/666 |
| 5,450,283 | 9/1995 | Lin et al. | 361/704 |
| 5,461,197 | 10/1995 | Hiruta et al. | 174/52.4 |
| 5,554,887 | 9/1996 | Sawai et al. | 257/737 |
| 5,578,525 | 11/1996 | Mizukoshi | |
| 5,619,070 | 4/1997 | Kozono | 257/692 |

FOREIGN PATENT DOCUMENTS

| | | |
|---|---|---|
| 1179334 | 7/1989 | Japan . |
| 3250649 | 11/1991 | Japan . |
| 5226509 | 9/1993 | Japan . |
| 5283460 | 10/1993 | Japan . |

*Primary Examiner*—Kevin M. Picardat
*Assistant Examiner*—Deven M. Collins
*Attorney, Agent, or Firm*—Leydig, Voit & Mayer

[57] ABSTRACT

A semiconductor device includes an encapsulating resin encapsulating a semiconductor substrate, a lead pattern or a laminated wiring layers transferred or secured on the lower surface of the encapsulating resin and a plurality of external electrode disposed on the lower surface of the lead pattern. The device may be manufactured by bonding a semiconductor substrate to a transferring substrate on which a lead pattern is formed, resin encapsulating an upper portion of the transferring substrate to cover the semiconductor substrate, and removing only the transferring substrate with the lead pattern left bonded to the encapsulating resin and the semiconductor substrate.

8 Claims, 14 Drawing Sheets

METHOD OF MANUFACTURING SEMICONDUCTOR DEVICE

This disclosure is a divisional of patent application Ser. No. 08/571,604, filed on Dec. 13, 1995 now U.S. Pat. No. 5,969,426.

BACKGROUND OF THE INVENTION

This invention relates to a semiconductor device capable of being made thin and having a high reliability and a manufacturing method therefor.

In recent years, semiconductor devices are being made small-sized and multi-pin in order to be miniaturized and multi-functioned. FIG. 26a is a perspective view of a semiconductor device proposed for realizing miniaturization, and FIG. 26b is a fragmental sectional view of a portion around an external connection electrode of this semiconductor device. In FIGS. 26a and 26b, on a surface of a semiconductor substrate 1 on which an electrical circuit (not shown) is formed, a bonding pad 2 made of an aluminum alloy or the like for an external connection and an electrically insulating film 3 made of SiN, SiO or the like for electrical circuit protection are formed. On the bonding pad 2 on the semiconductor substrate 1, an intimate contact layer and a diffusion protection layer are provided. Also provided in this semiconductor device are substrate metal layer 4 composed of a plurality of metal layers, a protective layer 5 made of polyimide or the like and having an opening at a region corresponding to the substrate metal layer 4 for external connection, transfer bumps 7 formed by transferring electrodes formed on the substrate (not shown), encapsulating resin 8 encapsulating all of the above-mentioned components 1 to 7, and external electrodes 9 for external connection.

Since the external electrodes 9 are provided on the semiconductor substrate 1 in the above semiconductor device 1, a very small semiconductor device in which only the thickness of the encapsulating resin 8 is increased can be realized on the semiconductor substrate 1.

FIGS. 27a to 27e are sectional views illustrating the steps of a semiconductor device manufacturing method disclosed in Japanese Patent Laid-Open No. 1-179334. The manufacturing steps will now be described in conjunction with these FIGS. 27a to 27e. First, as shown in FIG. 27a, a resist 11 with a pattern therein is formed on a transferring substrate 10 made of copper, aluminum, stainless steel or the like and having a thickness of the order of 0.1 mm to 3 mm, and a lead pattern 12 made of copper, aluminum or the like having a thickness of the order of 5 $\mu$m to 50 $\mu$m is formed in the openings by electrolytic plating, for example. Then, as shown in FIG. 27b the semiconductor substrate 1 is bonded on the lead pattern 12 by means of an electrically conductive bonding material 13, such as solder, an electrically conductive paste or the like. This is further entirely covered by the encapsulating resin 8 as shown in FIG. 27c. Then, by removing the transferring substrate 10, the semiconductor device shown in FIG. 27d is obtained. If desired, as shown in FIG. 27e, the lead pattern 12 may be extended outwardly of the encapsulating resin 8 so as to be adapted to the bonding position on the circuit board on which the semiconductor device is to be mounted.

FIG. 28 is a sectional view of the semiconductor device disclosed in Japanese Patent Laid-Open No. 5-283460. In this semiconductor device, a lead pattern 12 is disposed on an electrically insulating base film 14 and a semiconductor substrate 1 is encapsulated on the base film 14 with an encapsulating resin 8. The lead pattern 12 is exposed at the openings of the base film 14 at which an external connection electrodes 15 are formed.

Further, when high density wiring and good electrical characteristics (a low dielectric factor) are required in packages such as a pin grid array (PGA), ball grid array (BGA) or the like, a thin film, multi-layered laminated substrate has been used. FIG. 29 is a sectional view of a semiconductor device utilizing a conventional organic material multi-layered laminated substrate. In the figure, the reference numeral 31 is a semiconductor element, 32 are projection electrodes of the semiconductor element 31, 33 is a core substrate, 34 are laminated wiring layers, and 35 are internal electrode pads on the surface layer of the laminated wiring layers 34 connected to the projection electrodes. The reference numeral 36 is a wiring inside of the laminated wiring layers 34, 37 is an electrically insulating layer made, for example, of polyimide, 38 is a through hole for electrically connecting the obverse and the reverse surfaces of the core substrate 33 made, for example, of glass epoxy, 39 are external electrode pads, 40 are solder balls attached to the external electrode pads 39, 41 is a mold resin for encapsulating the semiconductor element 31 and 42 is a solder resist covering the wiring on the surface layer with the internal electrode pads 35 exposed.

The operation of the above conventional device will now be described. The electrical power and the external signals are supplied from the land of the mounting board on which the semiconductor device is mounted to the external electrode pads 39 through the solder balls 40, and transmitted to the wiring 36 of the laminated wiring layer 34 on the reverse side of the core substrate 33 and further through the through holes 38 of the core substrate 33 to the wiring 36 of the laminated wiring layer 34 on the obverse side of the core substrate 33. The signals are further transmitted from the wiring 36 to the semiconductor element 31 through the internal electrode pads 35 and the projection electrode 32. The outputs from the semiconductor element 31 are transmitted to the external circuit through the same passage in the reverse order.

FIG. 30 is a sectional view showing a conventional semiconductor device, in which the reference numeral 61 is a semiconductor substrate, 62 is a wiring, 63 are metal wires connecting the semiconductor substrate 61 and the wiring 62, 64 is a core substrate, 65 are through holes provided in the core substrate 64, 66 are solder balls attached to the bottom surface of the core substrate 64 through external electrode lands 67 and 68 is an encapsulating resin. In the conventional semiconductor device shown in FIG. 26, similar to the device shown in FIG. 27, there is a problem in that not very many external electrodes can be provided on the semiconductor device because the external electrodes can be attached only to the bottom surface of the semiconductor substrate.

Also, in the conventional semiconductor device shown in FIG. 27, the lead pattern 12 is formed on the transferring substrate 10, and the lead pattern 12 and the semiconductor substrate 1 are bonded to transfer the lead pattern 12 to the semiconductor substrate 1 which then is covered and encapsulated with the resin. However, in this device, since the section to which the external electrodes are to be formed is provided only on the bottom surface of the semiconductor substrate 1, it is not possible to provide a large number of external electrodes.

In the example shown in FIG. 28, the lead pattern 12 is provided on the base film 14, so that the thickness of the base film 14 may raise a problem in decreasing the overall thickness of the semiconductor device.

Further, in the package shown in FIG. 29 in which the conventional multi-layered laminated substrate made of an organic material is used, the semiconductor element is mounted to the substrate having a laminated wiring layer on either or both surfaces of the core substrate and is provided with external electrode pads on the surface of the substrate opposite to the surface on which the semiconductor element is mounted and resin coated. The signal from the semiconductor element is transmitted to an external electrode through the through holes in the core substrate. With such a structure, since the through holes are not flat at their top portions, the formation of the wiring on the through hole is difficult and discontinuous or narrowed sections may be formed. Therefore, in the usual design, the wiring is not formed on the through holes, so that the wiring density becomes low and impedes the miniaturization of the package.

Also in the device shown in FIG. 29, the core substrate or the substrate of the organic material such as glass epoxy has a structure of resin-impregnated woven glass fiber for mechanical strength, so that the migration of wiring material, Cu can take place along the interface between the glass fiber and the resin, causing leakage between the through holes. Therefore, a quad flat pack (QFP) type package, in which the external leads extend only from the outer periphery of the substrate instead of providing the external electrodes on the bottom surface of the substrate, is generally used. In order to cope with this problem. A ceramic substrate may not need through holes in the core substrate. However, with the ceramic substrate, the thermal expansion coefficient does not match with the plastic mounting substrate such as glass epoxy which is commonly used in electronic devices causing stresses to be applied to the solder balls of the external electrodes, decreasing the reliability of the mounting and packaging.

A laminated substrate which does not use a core substrate can be obtained In accordance with the manufacturing method of a laminated substrate in which a plurality of wired films of an organic material is disclosed in Japanese Patent Laid-Open No. 3-250649 and Japanese Patent Laid-Open No. 5-226509. However, since the device does not have a sufficient rigidity because there is no core substrate, errors may occur during the package manufacturing process in the wire bonding step in which the rigidity of the substrate is required and in the flip chip bonding step in which flatness of the substrate is required. Also, the internal electrode pads may become displaced from the designed pitch due to the dimensional instability of the film of the organic material. Further, in the manufacturing method of Japanese Patent Laid-Open No. 3-250649 and Japanese Patent Laid-Open No. 5-226509, since the film of each layer does not include reinforcing material for providing mechanical strength, such as woven glass fiber, woven carbon fiber or the like, the film can be easily deformed so that it is necessary to have a thickness of at least several tens $\mu$m or more, whereby a thin substrate cannot be obtained.

Also, in the conventional device shown in FIG. 30, the core substrate 64 is provided for package rigidity for forming wiring 64, so that the thickness of the package is increased by the thickness of the core substrate 64, preventing decrease of the thickness. Further, while the core substrate 64 has formed therein through holes 65 for the electrical connection between the wiring 62 and the external electrodes, the problem of leakage between the through holes 65 may occur and reliability decreased.

SUMMARY OF THE INVENTION

Accordingly, an object of the present invention is to provide a semiconductor device free from the above-discussed problems of the conventional semiconductor device.

Another object of the present invention is to provide a semiconductor device in which a fine lead pattern can be formed.

Still another object of the present invention is to provide a thin semiconductor device.

Another object of the present invention is to provide a semiconductor device in which the cause of the leakage between the through holes is eliminated by using no through holes in the core substrate.

A further object of the present invention is to provide a semiconductor device in which a fine lead pattern can be formed, the overall device can be made thin, and in which the cause of the leakage between the through holes is eliminated by eliminating the through holes in the core substrate.

Still another object of the present invention is to provide a semiconductor device manufacturing method in which the reliability of the mounting package is increased.

With the above objects in view, the present invention resides in a semiconductor device comprising an encapsulating resin for encapsulating a semiconductor substrate, a lead pattern transferred on the lower surface of the encapsulating resin and a plurality of external electrode disposed on the lower surface of the lead pattern.

The semiconductor device of the present invention may comprise an encapsulating resin for encapsulating a semiconductor substrate, a plurality of laminated wiring layers transferred on the lower surface of the encapsulating resin and a plurality of external electrode disposed on the lower surface of the laminated wiring layers.

The semiconductor device of the present invention may comprise an encapsulating resin for encapsulating a semiconductor substrate, a lead pattern composed of a lead frame secured to the lower surface of the encapsulating resin and a plurality of external electrodes disposed on the lower surface of the lead pattern.

The method for manufacturing a semiconductor device of the present invention comprises the steps of: forming a lead pattern on a transferring substrate; bonding a semiconductor substrate on the transferring substrate on which the lead pattern is formed; resin encapsulating an upper portion of the transferring substrate to cover the semiconductor substrate; and removing the transferring substrate only with the lead pattern left bonded to the encapsulating resin and the semiconductor substrate.

The method for manufacturing a semiconductor device of the present invention may comprise the steps of: forming a plurality of laminated wiring layers on a transferring substrate; bonding a semiconductor substrate on the transferring substrate on which the laminated wiring layers are formed; resin encapsulating an upper portion of the transferring substrate to cover the semiconductor substrate; and removing the transferring substrate only with the laminated wiring layers left bonded to the encapsulating resin and the semiconductor substrate.

The method for manufacturing a semiconductor device of the present invention may comprises the steps of: die-bonding and connecting a semiconductor chip to a lead frame; encapsulating an upper portion of the lead frame with resin to cover the semiconductor chip; and forming a plurality of external electrodes on a lower surface of the lead frame.

The semiconductor device may further comprise a bonding layer, disposed between the semiconductor substrate and the lead pattern composed of the lead frame, for bonding the semiconductor substrate and the lead pattern.

The semiconductor device may have the lower surface of the encapsulating resin and the lead pattern that is coated with a resin or covered with an encapsulating resin.

The method for manufacturing a semiconductor device of the present invention may comprise the steps of: forming a lead pattern on a transferring substrate; bonding a semiconductor substrate on the transferring substrate on which the lead pattern is formed; bonding a frame surrounding the semiconductor substrate on the lead pattern; resin encapsulating an upper portion of the transferring substrate to cover the semiconductor substrate; and removing the transferring substrate only with the lead pattern left bonded to the encapsulating resin and the semiconductor substrate.

The method for manufacturing a semiconductor device may comprise the steps of: forming a plurality of laminated wiring layers on a transferring substrate; bonding a semiconductor substrate on the transferring substrate on which the laminated wiring layers are formed; bonding a frame surrounding the semiconductor substrate on the laminated wiring layer; resin encapsulating an upper portion of the transferring substrate to cover the semiconductor substrate; and removing the transferring substrate only with the laminated wiring layers left bonded to the encapsulating resin and the semiconductor substrate.

BRIEF DESCRIPTION OF THE DRAWINGS

The present invention will become more readily apparent from the following detailed description of the preferred embodiments of the present invention taken in conjunction with the accompanying drawings, in which:

FIG. 26b is a fragmental sectional view of the semiconductor device shown in FIG. 26a;

DESCRIPTION OF THE PREFERRED EMBODIMENTS

Embodiment 1

Figure 1:
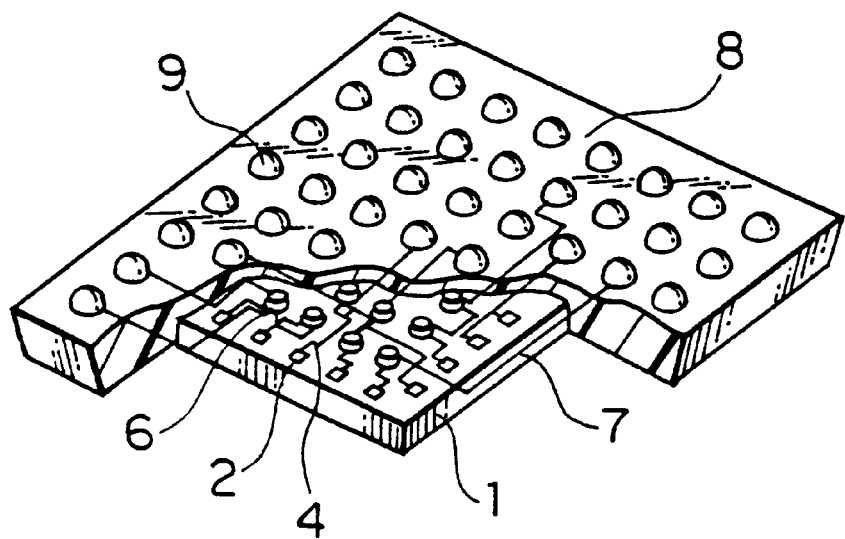
FIG. 1 is a perspective view of a semiconductor device of the first (1st) embodiment of the present invention.
Figure 2:
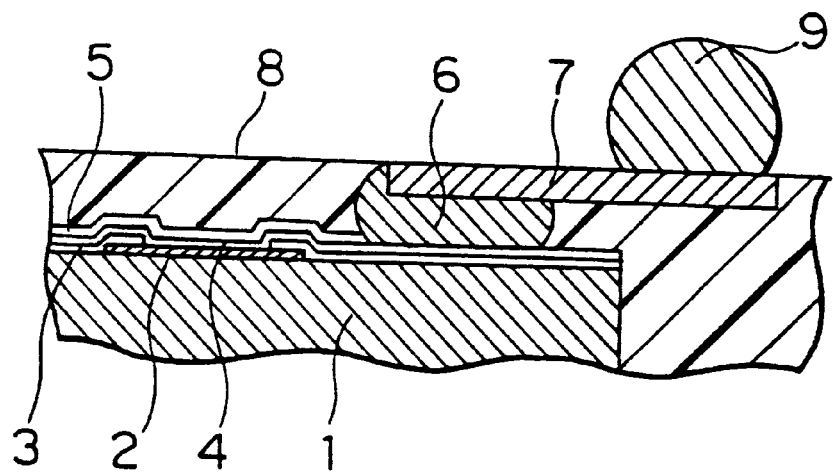
FIG. 2 is an enlarged sectional view of the electrical connection portion of the semiconductor device of the first embodiment shown in FIG. 1.

FIG. 1 is a perspective view of a semiconductor device of a first (1st) embodiment of the present invention, FIG. 2 is an enlarged sectional view of the electrical connection portion of the device shown in FIG. 1, and FIGS. 3a to 3d are sectional views illustrating the steps of manufacturing the semiconductor device.

In FIGS. 1 and 2, the reference numeral 1 is a semiconductor substrate, 2 are bonding pads made of an aluminum alloy or the like for external connection, 3 is an electrically insulating film made of SiN, SiO or the like for the electric circuit protection, 4 are substrate metal layers formed on the bonding pads 2 and composed of a multi-layered metal layer including an intimate contact layer and a diffusion prevention layer, 5 is a protective film made of polyimide or the like having openings at the regions corresponding to the substrate metal layers 4 for external connection, 6 are bonding layers for bonding to the external electrodes, 7 is a lead pattern formed by transferring thereonto the electrode formed on the transferring substrate 10, 8 is a resin molded to cover all of the above mentioned components 1 to 7, and 9 are external electrodes for the external connections.

Figure 3A:
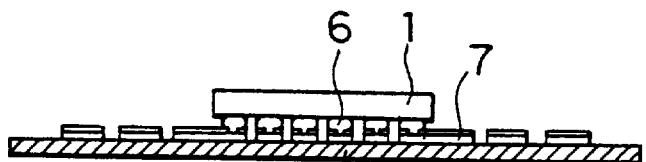
FIGS. 3a to 3d are sectional views illustrating the steps of manufacturing method of the semiconductor device.

Steps of manufacturing Embodiment 1 will now be described in conjunction with FIGS. 3a to 3d. In this manufacturing method, as shown in FIG. 3a, the transferring substrate 10 is prepared and the lead pattern 7 is formed on this substrate. The structure of the transferring substrate 10 is such that, as shown in the sectional view of FIG. 4, a thermoplastic resin layer 17 is formed on a metal substrate 16 made of copper, stainless steel or the like having a thickness of the order of about 50 $\mu$m and easy to handle, a thermosetting resin layer 18 is formed on the thermoplastic resin layer 17, and further a lead pattern 7 is formed on the thermosetting resin layer 18. In forming the lead pattern 7, a conductive film layer (not shown) made of copper, aluminum or the like is formed on the thermosetting resin layer 18, and a resist pattern is applied on the conductive film (not shown) and the lead pattern 7 is formed by etching. As previously described, the bonding layer 6 is formed on either the semiconductor substrate 1 or the thermal transferring substrate 10 by ball-setting, screen printing, vapor deposition, plating, or the like. The semiconductor substrate 1 is face-down bonded onto the transferring substrate 10. FIG. 3a illustrates the section of the device after bonding.

Figure 3B:
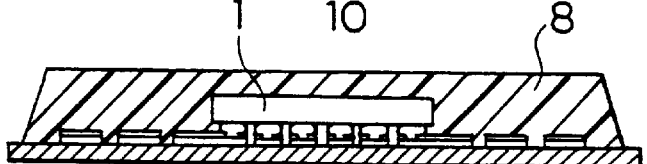
Figure 3C:
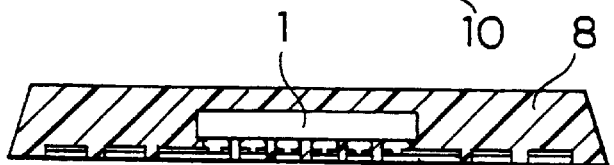
Figure 3D:
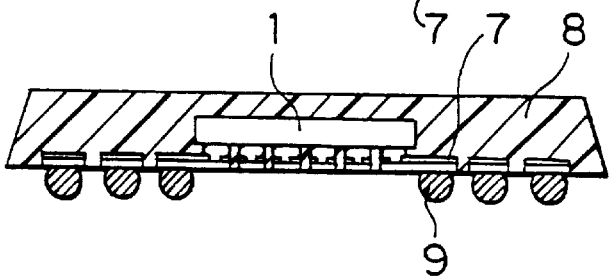

Then, the entire upper side of the transferring substrate 10 is covered with the encapsulating resin 8 as shown in FIG. 3b and the transferring substrate 10 is removed as shown in FIG. 3c. Further, the external connection electrodes 9 are provided by the ball-setting method as shown in FIG. 3d. The semiconductor devices as shown in FIGS. 1 and 2 thus can be manufactured.

With the semiconductor device of this embodiment, the following advantages can be obtained. The lead pattern 7 is transferred from the transferring substrate 10 to the bonding layer 6 and the encapsulating resin 8 and thereafter the transferring substrate 10 is removed. That is, the formation of the lead pattern 7 is achieved on the transferring substrate 10, the semiconductor substrate 1 and its vicinity are made rigid by the molded encapsulating resin 8, and the lead pattern 7 is formed by transfer on the bottom surface of the semiconductor substrate 1 and the encapsulating resin 8. Therefore, the core substrate used in the conventional semiconductor device may be eliminated, enabling the overall semiconductor device to be thin. Also, by eliminating the core substrate, the through holes which were provided in the core substrate of the conventional semiconductor device for electrically connecting the external electrodes and the lead pattern can be eliminated, so that the problems of leakage of signals or the like between the neighboring through holes can be eliminated and the problem of the high density wiring being prevented because the wiring cannot be formed on the through holes can be eliminated.

Figure 4:
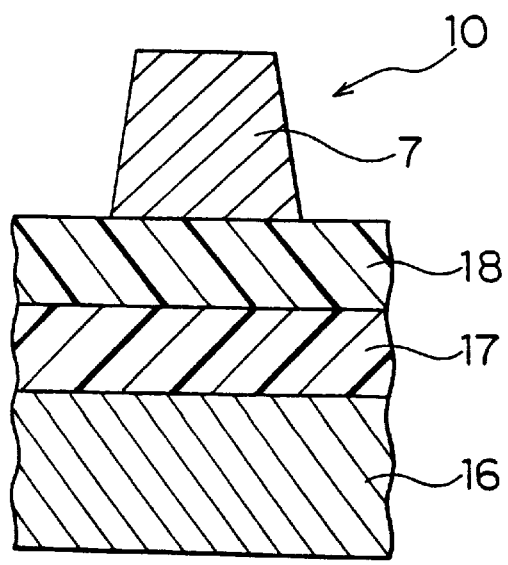
FIG. 4 is a sectional view of the transferring substrate used in the first embodiment.

Also in the first embodiment, as shown in FIG. 4, the transferring substrate 10 includes the thermosetting resin layer 18 and the lead pattern 7 is formed on this thermosetting resin layer 18, so that the bonding force between the lead pattern 7 and the thermosetting resin layer 18 does not change and is kept constant even during the heating at the time of transferring the lead pattern 7. Therefore, the occurrence of poor transfer or transfer failure in which the lead pattern 7 is removed together with the transferring substrate 10 when it is removed can be prevented. Also, in the first embodiment, the thermoplastic resin layer 17 is interposed between the thermosetting resin layer 18 and the metal substrate 16 are sufficiently bonded by this thermoplastic resin layer 17. Thus, when the transferring substrate 10 is being separated, as shown in FIG. 3c, the metal substrate 16 is removed and the thermosetting resin 18 does not remains bonded to the lead pattern 7.

Also, in the first embodiment, since the lead pattern 7 is formed on the metal substrate 16, which is small in thermal expansion difference, sufficiently strong for easy handling, and inexpensive, the pattern may be formed to have a pattern width equal to or less than 100 $\mu$m, allowing the multi-pin semiconductor device having more than several hundred pins to be inexpensively realized. Further, it is possible to form the external electrodes 9 in the region outside of the semiconductor substrate 1 with the lead pattern 7 and, by making these external electrodes 9 projections, the external electrodes 9 can be provided in an array on the top surface or the bottom surface of the semiconductor device thereby to increase the pitch of the external electrodes 9, so that the mounting of the semiconductor device to the circuit board is easy.

Embodiment 2

Figure 5:
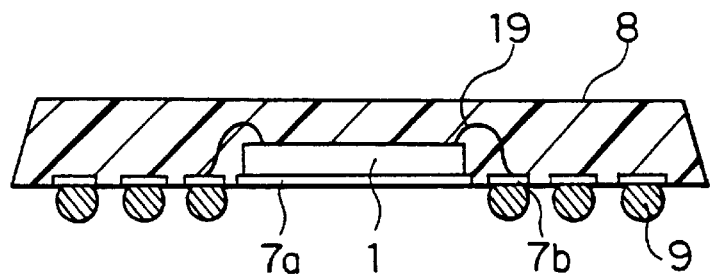
FIG. 5 is a sectional view of a semiconductor device of the second (2nd) embodiment of the present invention.
Figure 6:
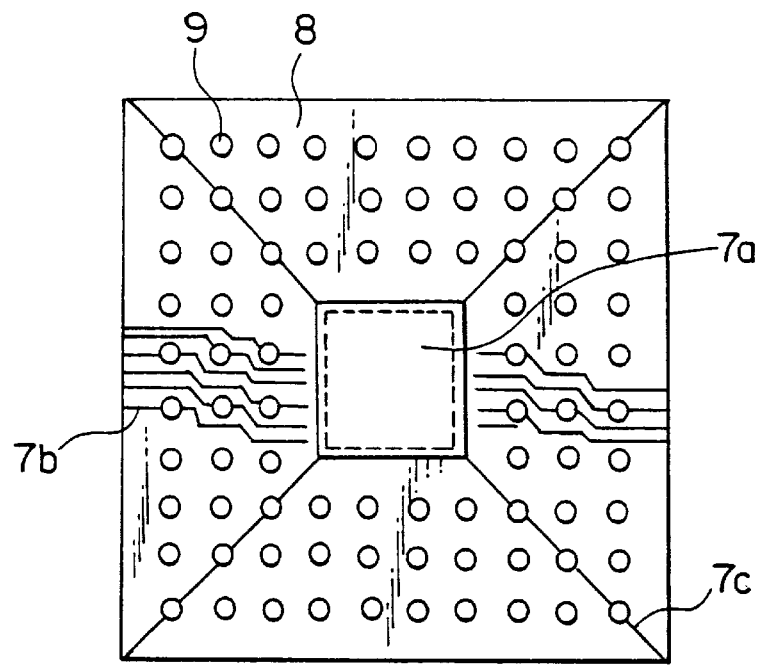
FIG. 6 is a bottom view of the semiconductor device shown in FIG. 5.

FIG. 5 is a sectional view of a semiconductor device of a second embodiment of the present invention and FIG. 6 is a bottom view of the semiconductor device shown in FIG. 5. In this embodiment 2, a lead frame commonly used in semiconductor devices is employed in place of the lead pattern 7 of embodiment 1. More particularly, in FIGS. 5 and 6, the reference numeral 1 is the semiconductor substrate, 7a is a die pad portion of the lead frame, 7b is a lead pattern made of the lead frame, 7c is a die pad suspension lead of the lead frame for supporting the die pad portion 7a, 8 is the encapsulating resin and 9 are external electrodes.

A method of manufacturing the device of embodiment 2 will now be described with reference to FIG. 5. In the method of manufacturing embodiment 2, as in the common semiconductor device manufacturing method, the semiconductor substrate 1 is die bonded to the die pad portion 7a of the lead frame. Then, the lead pattern 7b and the bonding pads (not shown) on the semiconductor substrate 1 are wire-bonded by means of metal wires 19. The electrical connections from the metal wires 19 to the external electrodes 9 are provided by the lead pattern 7b. Then the lead pattern 7b is covered with the molded encapsulating resin 8. Finally, the ball-shaped external electrodes 9 are provided on the bottom surface of the lead pattern 7b, whereby the semiconductor device of embodiment 2 is completed.

In this embodiment 2, since the overall rigidity of the semiconductor device is provided by the encapsulating resin 8 molded on the lead pattern 7b made of the lead frame, the core substrate which was used in the conventional semiconductor device is not needed and therefore the overall semiconductor device can be made thin. In a similar manner, by eliminating the core substrate, the through holes which have been provided in the core substrate for electrically connecting the external electrodes and the lead pattern can also be eliminated, the problem of signal leakage between the neighboring through holes can be averted as can the obstacles to a higher wiring density due to the impossibility of wiring on the through holes. In this embodiment 2, since the lead frame is employed as the extension wiring, the width of the lead pattern 7b is limited to 100 μm, so that it is only applicable to a semiconductor device with no more than 100 pins. In this embodiment 2, most of the device can be manufactured by the common semiconductor manufacturing techniques, so that the semiconductor device can be realized at low cost.

Embodiment 3

Figure 7:
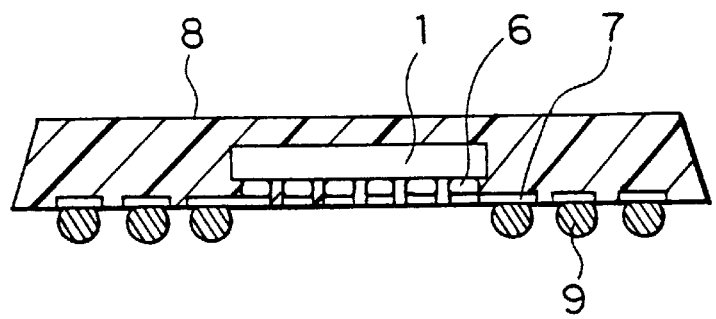
FIG. 7 is a sectional view of a semiconductor device of the third (3rd) embodiment which is one application of the second embodiment.

FIG. 7 illustrates a third embodiment of the present invention which is one application of the second embodiment. While the electrical connection between the semiconductor substrate 1 and the lead pattern 7 is made by means of the metal wires 19 in the second embodiment, in this third embodiment, the bonding layer 6 is formed on the semiconductor substrate 1 or on the lead pattern 7, and the electrical connection of the semiconductor substrate 1 to the lead pattern 7 made of the lead frame is made by face-down bonding through the use of the bonding layer 6. In this third embodiment, the bonding layer 6 may be formed in an array on the semiconductor substrate 1. Therefore, a good connection can be realized even in the case where the bonding pads in the second embodiment cannot be formed because the semiconductor substrate 1 is small.

Embodiment 4

Figure 8:
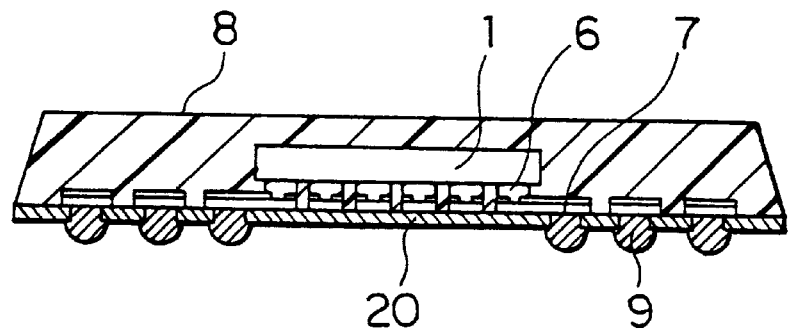
FIG. 8 is a sectional view of a semiconductor device of the fourth (4th) embodiment which is one application of the first to the third embodiments.

The fourth embodiment of the present invention which is one application of embodiments 1 to 3 will now be described in conjunction with FIG. 8. While FIG. 8 illustrates an application of the first embodiment, this is also applicable to embodiments 2 and 3. In this embodiment 4, the bottom surface of the semiconductor device, except for the region in which the external electrodes 9 are formed is coated with a resin 20. The resin 20 can be formed such as by screen printing using a solder resist or the like, whereby it is possible to control the position of the external electrodes 9 and the solder flow and to protect the lead pattern 7, realizing improvements in the reliability of the semiconductor device.

Embodiment 5

Figure 9:
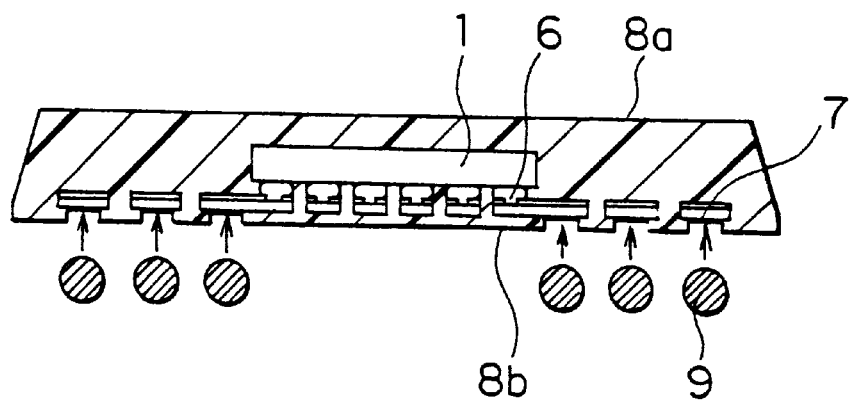
FIG. 9 is a sectional view of a semiconductor device of the fifth (5th) embodiment which is one application of the first to the third embodiments.

FIG. 9 illustrates one application of embodiments 1 to 3. In this embodiment, similar objects and the advantages of embodiment 4 can be obtained and before the external electrodes 9 are formed the region on the bottom surface of the lead pattern 7, except for the bonding region of the external electrodes 9, is coated with the encapsulating resin 8b.

Embodiment 6

Figure 10:
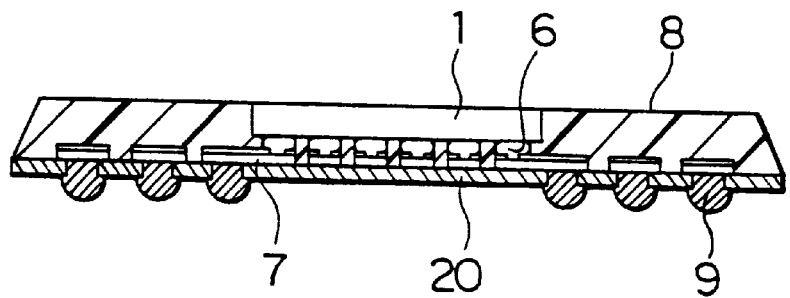
FIG. 10 is a sectional view of a semiconductor device of the sixth (6th) embodiment which is one application of the first to the third embodiments.

FIG. 10 illustrates one application of embodiments 1 to 3. In this embodiment, the reverse face of the semiconductor substrate 1 is exposed through the encapsulating resin 8, which is applicable irrespective of the presence of the resin coating 20. This improves the dissipation of the heat generated in the semiconductor substrate 1. By providing a heat dissipating fin (not shown) on the exposed surface of the semiconductor substrate 1, the heat dissipation can be further improved.

Embodiment 7

Figure 11:
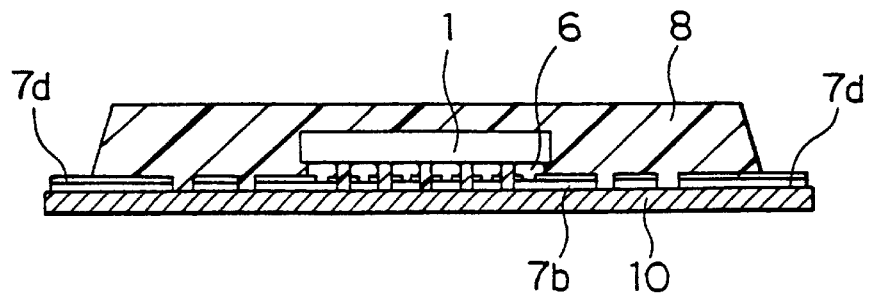
FIG. 11 is a sectional view of a semiconductor device of the seventh (7th) embodiment which is one application of the first to the third embodiments before the transferring substrate removed.

FIG. 11 illustrates one application of embodiments 1 to 3. FIG. 11 is a sectional view prior to the removal of the transferring substrate 10. In this embodiment, the lead pattern 7b extends outside of the encapsulating resin 8, thereby to form the test pads 7a. This allows the burning-in and repairing prior to the formation of the external electrodes 9 or the encapsulation within the encapsulating resin 8.

Embodiment 8

Figure 12:
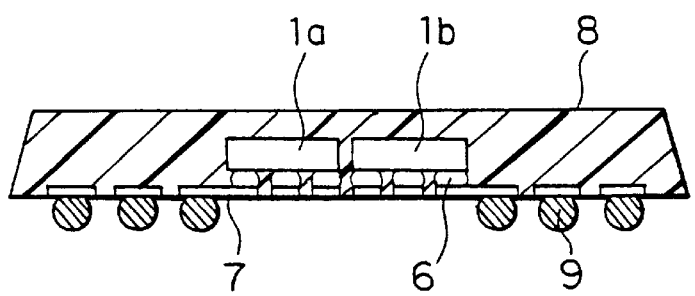
FIG. 12 is a sectional view of a semiconductor device of the eighth (8th) embodiment which is one application of the first to the third embodiments.

FIG. 12 illustrates one application of embodiments 1 to 3. In this embodiment, a plurality of semiconductor substrates 1a and 1b as well as electronic components (not shown) or the like are provided within the encapsulating resin 8 and these parts are bonded to the lead pattern 7 by means of the bonding layer 6. According to this embodiment, a high density-mounted semiconductor device can be obtained.

Embodiment 9

Figure 13:
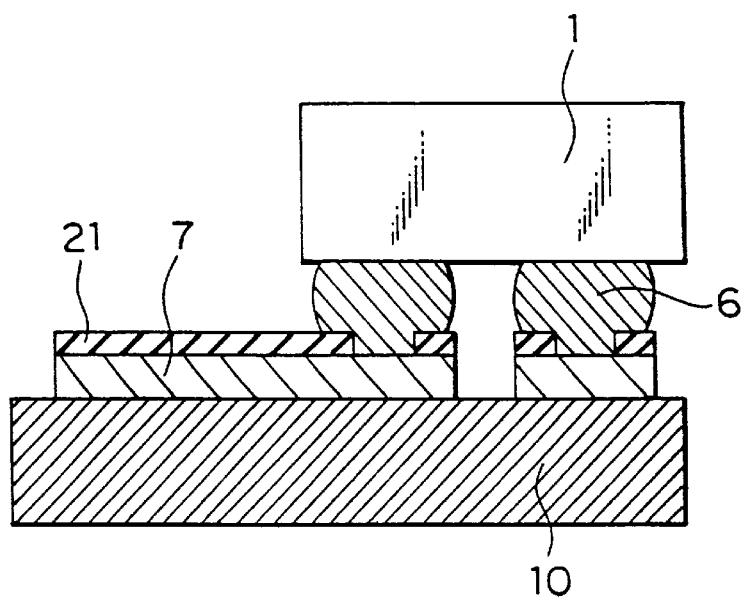
FIG. 13 is an enlarged sectional view of the bonding layer portion of the semiconductor device of a ninth (9th) embodiment which is one application of the first to the third embodiments.

FIG. 13 illustrates one application of embodiment 3. FIG. 13 is an enlarged sectional view of the bonding layer 6 and its vicinity in the semiconductor device. In this embodiment, the region on the lead pattern 7 formed on the transferring substrate 10, except for the region bonded to the bonding layer 6, is covered with a protective film 21 made of an electrically insulating material such as polyimide or a solder resist. According to this embodiment, the diffusion of the bonding layer 6 into the lead pattern 7 is prevented and the height and the configuration of the bonding layer 6 can be controlled, resulting in a highly reliable semiconductor device.

Embodiment 10

Figure 14:
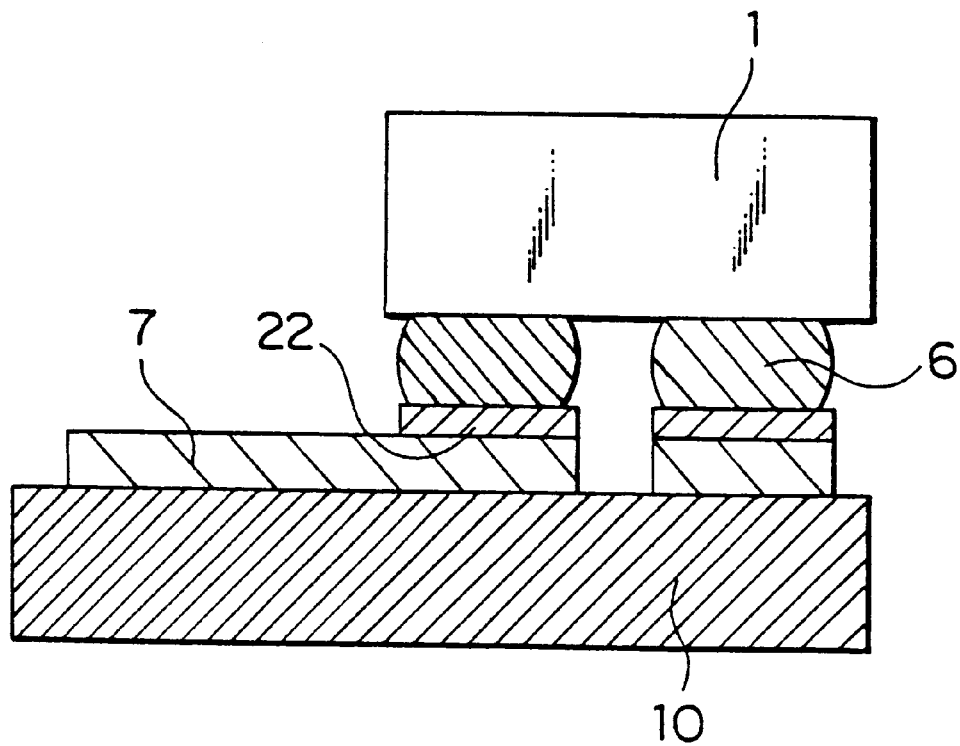
FIG. 14 is an enlarged sectional view of the bonding layer portion of the semiconductor device of a tenth (10th) embodiment which is one application of the first to the third embodiments.

FIG. 14 illustrates one application of embodiments 1 to 3. FIG. 14 is an enlarged sectional view similar to FIG. 13. In this embodiment, a plated layer 22 made of silver is formed only on the bonding region relative to the bonding layer 6 on the lead pattern 7 so that only the plated layer 22 is brought into contact with the bonding layer 6. Therefore, according to this embodiment, advantages similar to those of embodiment 9 can be obtained.

Embodiment 11

Figure 15:
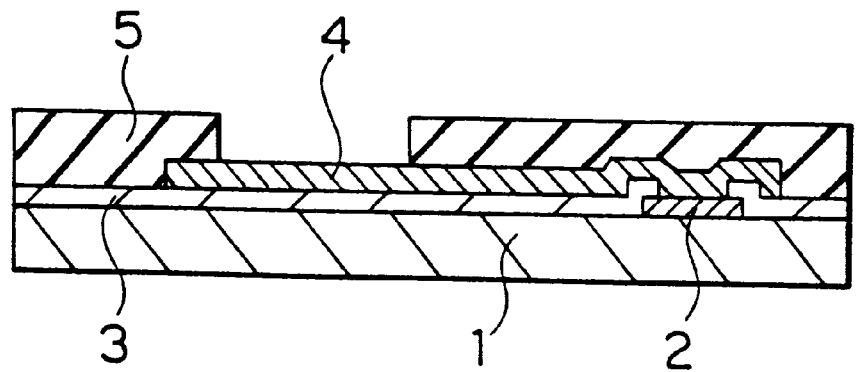
FIG. 15 is a sectional view of the bonding pad portion of the semiconductor device of a eleventh (11th) embodiment which is one application of the first to the third embodiments.

FIG. 15 illustrates one application of embodiments 1 to 3. FIG. 15 is an enlarged sectional view of the portion in the vicinity of the bonding pads 2 of the semiconductor device (being manufactured) on which the protective film 5 is disposed. In this embodiment, the electrical connections of the bonding pads 2 located on the common semiconductor substrate 1, to the external electrodes and the lead pattern are achieved of the wiring by the substrate metal layer 4 which is a multi-layered metal layer made of Ti/Ni/Au, TiN/Ni/Au, Ti/Pd, Ti/Cu/Au or the like. This substrate metal layer 4 prevents the diffusion of the aluminum alloy or the like forming the bonding pads 2 to prevent the bonding of the bonding layer 6.

According to this embodiment, since the size of the bonding pads 2 is sufficient if they are of the order of from 100 μm square to less than 50 μm square, the layout on the semiconductor substrate 1 is free, the design of the semiconductor device becomes easier and the semiconductor substrate 1 can be made smaller. Also, the exposed portion of the substrate metal layer 4 can be equal to or more than 50 μm, making the formation of the bonding layer easy and standardizing the position of the bonding layer. Further, the wafer test can be achieved by utilizing the exposed portion.

Embodiment 12

Figure 16:
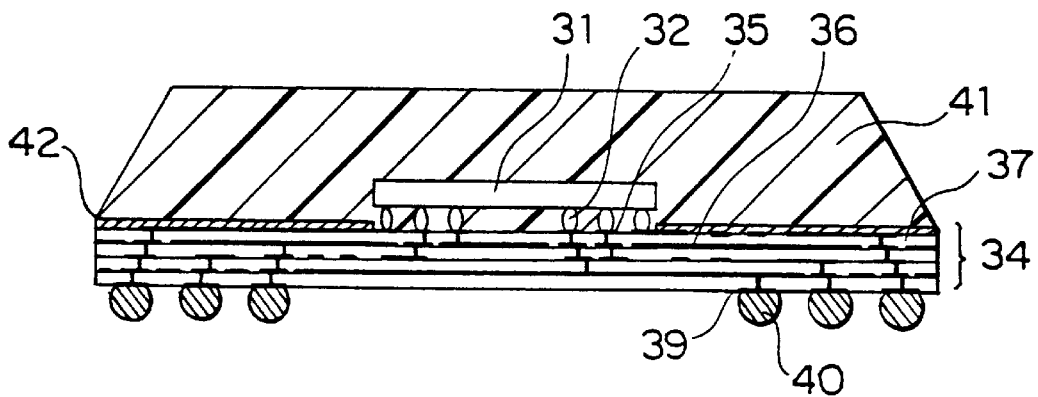
FIG. 16 is a sectional view showing a semiconductor device of the twelfth (12th) embodiment of the present invention.

FIG. 16 is a sectional view illustrating an embodiment 12 of the present invention. In FIG. 16, the reference numeral 31 is a semiconductor element, 32 is a projection electrode of the semiconductor element 31, 34 is a laminated wiring layer, 35 are inner electrode pads on the face surface of the laminated wiring layer 34 and are connected to the projection electrode 32. 36 is wiring of the inside of the laminated wiring layer 34, 37 is an insulating layer of the laminated wiring layer 34, 39 are external electrode pads, 40 are solder balls attached to the external electrode pads 39, 41 is a mold resin for encapsulating the semiconductor element 31 and for additionally providing the package main body with a mechanical strength, 42 is a solder resist coating the wiring on the surface layer so as to expose the inner electrode pads 35.

The operation of this embodiment 12 will now be described. The signal inputs and power supply to the semiconductor element 31 and the external circuit are transmitted through a passage extending from the land of the mounting substrate on which the semiconductor device is mounted to the semiconductor element 31 through the solder balls 40, the external electrode pads 39 of the laminated wiring layer 34, the wiring 36, the internal electrode pads 35 and through the projection electrodes 32. The outputs from the semiconductor element 31 are transmitted to the external circuit through a passage in the opposite direction.

The laminated wiring layer 34 is constructed by alternatively stacking the insulating layers 37 and the wiring layers 36 on the wiring layer of the external electrode pads 39, the electrical connections between each wiring layer 36 being achieved by providing holes in the insulating layers 37 and forming the upper wiring layer on the substrate wiring layer 36 by evaporation, sputtering, plating or the like. The material for the wiring may include Cu, Al and the like. The material for the insulating layer 37 may include polyimide and epoxy and a low dielectric material such as polyimide is used when an electrical property is particularly necessary. The insulating layer 37 includes no reinforcing fibers such as glass fibers or the like. With such construction, the thickness of the wiring layer 36 and the insulating layer 37 may be several tens to several $\mu$m, allowing the package to be thin. Also, since no through holes are provided and no woven glass fibers are included, resistance to moisture and resistance to leakage can be improved. Also, by providing the source plane and the GND plane within the wiring layer 36, the electrical properties can be improved.

Embodiment 13

Figure 17:
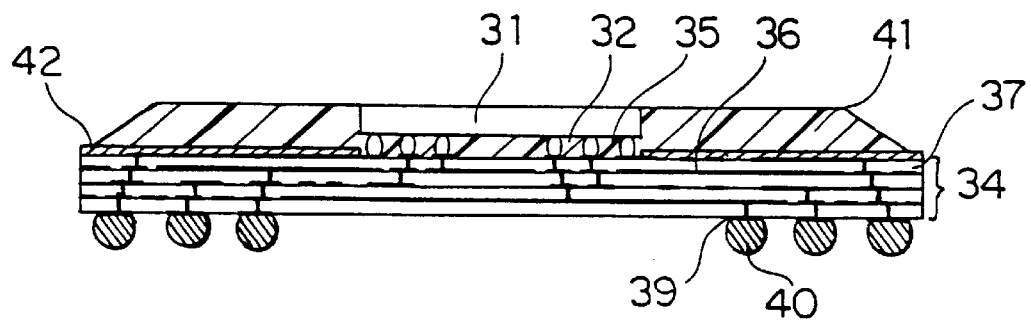
FIG. 17 is a sectional view showing a semiconductor device of the thirteenth (13th) embodiment of the present invention.

FIG. 17 illustrates a semiconductor device an embodiment 13 of the present invention in section. In the Figure, the reference numerals 31, 32, 34 to 37, 40 and 42 are components identical to those of embodiment 12. Also, in FIG. 17, the reference numeral 41 is a mold resin for encapsulating the semiconductor element 31 and for additionally providing the package main body with mechanical strength, which is formed to expose the reverse side of the semiconductor element 31.

The operation of this embodiment will now be described. The electrical operation is similar to that of embodiment 12. In this embodiment, since the reverse side of the semiconductor element 31 is exposed outside of the mold resin, the heat generated by the circuit operation can easily be dissipated and, even when a heat radiating fin is provided, the radiating fin can be brought into direct contact with the semiconductor element 31, so that the heat dissipation can be more efficient.

Embodiment 14

Figure 18:
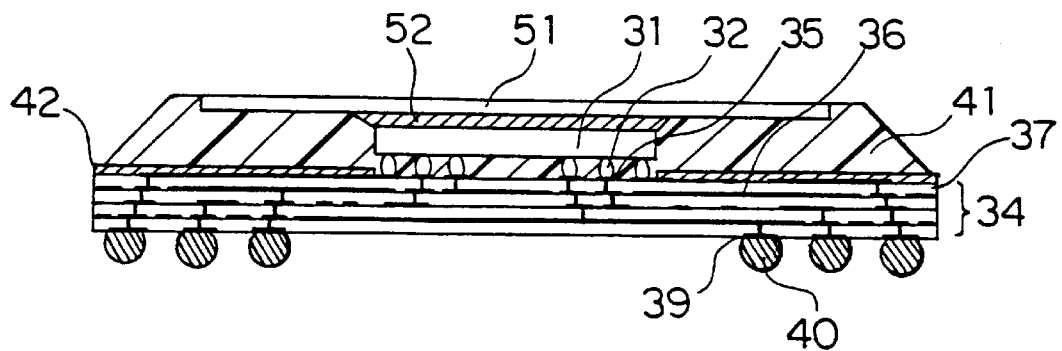
FIG. 18 is a sectional view showing the semiconductor device of a fourteenth (14th) embodiment of the present invention.

FIG. 18 is a sectional view illustrating a semiconductor device of an embodiment 14. In the figure, the reference numerals 31, 32, 34 to 37, 39, 40 and 42 are identical to those of embodiment 12. Also, in FIG. 18, the reference numeral 51 is a heat dissipating plate, 52 is a bonding agent bonding the heat dissipating plate 51 to the reverse side of the semiconductor element 31, the mold resin 41 is formed to expose the heat dissipating plate 51.

The operation of this embodiment will now be described. The electrical operation is similar to that of embodiment 12. In this embodiment, since the reverse side of the heat dissipating plate 51 bonded to the revere side of the semiconductor element 31 is exposed outside of the mold resin, a high heat dissipation can be expected even when no heat dissipation fin is mounted, so that a highly efficient heat dissipation can be obtained when the heat dissipation fin is mounted.

Embodiment 15

Figure 19:
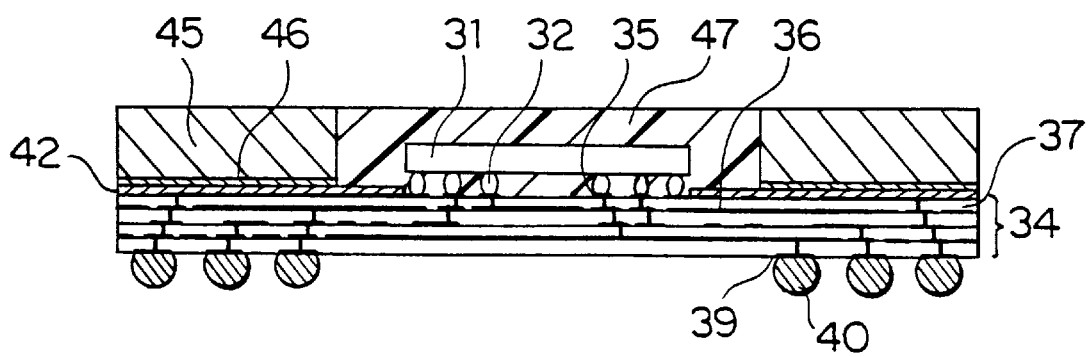
FIG. 19 is a sectional view showing the semiconductor device of a fifteenth (15th) embodiment of the present invention.

FIG. 19 is a sectional view showing the manufacturing steps of a semiconductor device according to embodiment 19 of the present invention. In the figure, the reference numerals 31, 32, 34 to 37, 39, 40 and 42 are the same components as in embodiment 12. Also, in FIG. 19, the reference numeral 45 is a frame for additionally providing the package main body with mechanical strength, 46 is a bonding agent for bonding the frame 45 to the laminated wiring layer 34 and 47 is a mold resin for encapsulating and protecting the semiconductor element 31.

The operation of embodiment 15, which achieves the same electrical operation as embodiment 12, will now be described. In this embodiment, since the package is provided with rigidity by the frame 45 instead of the mold resin 41 of embodiment 12, no thermal stresses act on the solder balls 40 and the connection becomes reliable when the frame 45 is made of a material having a coefficient of thermal expansion close to that of the mounting substrate to which the semiconductor device is mounted.

In this embodiment, a high heat dissipation capability can be obtained by externally exposing the reverse side of the semiconductor element 31 at the encapsulating region 47 or incorporating a heat dissipating plate thereinto in a manner similar to embodiments 13 and 14. The frame 45 for increasing the rigidity of the package may, of course, be applicable to a semiconductor device having the lead pattern 7 but not the multi-layered laminated wiring layer similar to that of embodiment 1.

Embodiment 16

Figure 20:
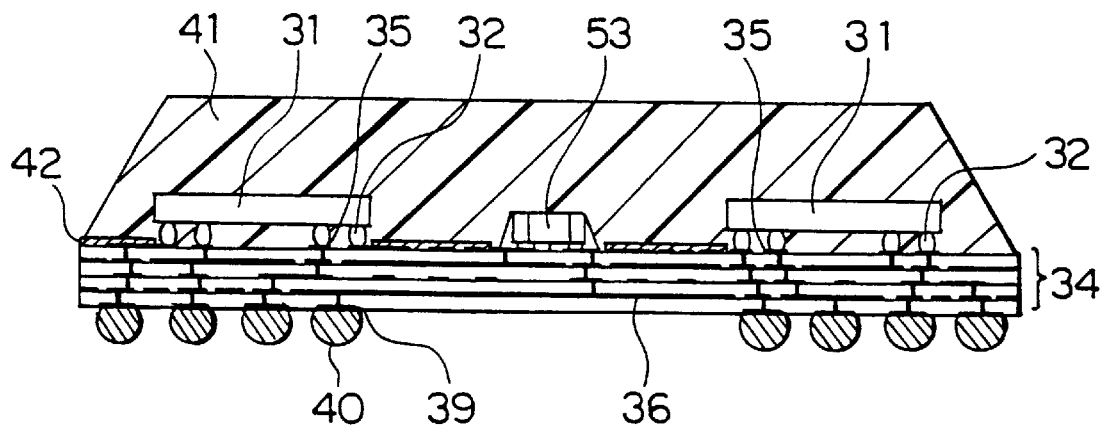
FIG. 20 is a sectional view showing the semiconductor device of a sixteenth (16th) embodiment of the present invention.

FIG. 20 is a sectional view illustrating a semiconductor device of an embodiment 16 of the present invention. In the figure, the reference numerals 31, 32, 35 to 37 and 39 to 42 are components similar to those of embodiment 12. In FIG. 20, 53 is a chip component such as a resistor or a capacitor.

The manufacture of this embodiment will now be described. Electrically, the semiconductor element 31 and the external circuit are connected to each other by the laminated wiring layer 34 and circuit wiring is formed on the laminated wiring layer 34 for connecting the plurality of semiconductor elements 31 and the chip components. Thus, the plurality of semiconductor elements 31 or chip components are assembled into one package, so that a semiconductor device having a higher mounting density and a higher performance and function can be obtained, allowing a smaller electronic device to be realized, in comparison with the case where each of the semiconductor elements 31 is packaged separately.

Embodiment 17

FIGS. 21a, 21b, 21c and 21d are sectional views illustrating steps for manufacturing a semiconductor device according to an embodiment 17 of the present invention. In these figures, the reference numeral 31 is a semiconductor element, 32 are projection electrodes of the semiconductor element 31, 34 is a laminated wiring layer, 35 are internal electrode pads on the surface layer of the laminated wiring layer 34, the internal electrode pads 35 being connected to the projection electrodes 32. The reference numeral 36 is wiring within the laminated wiring layer 34, 37 is an electrically insulating layer of the laminated wiring layer 34, 39 are external electrode pads, 40 are solder balls attached to the external electrode pads 39, 41 is a mold resin encapsulating the semiconductor element 31 and additionally providing the package main body with mechanical strength, 42 is a solder resist covering the wiring on the surface layer so as to expose the internal electrode pads 35, 43 is a core frame made, for example, of Cu and stainless steel (SUS) and 44 is a resin layer for preliminarily bonding the laminated wiring layer 34 to the core frame 43.

The manufacture of this embodiment will now be described. First, the step of forming the laminated wiring layer 34 on the core frame 43 will be described in conjunction with FIG. 21a. After the thermoplastic or thermosetting resin layer 44 is applied to the core frame 43, a copper foil is laminated thereon and the external electrode pads 39 are formed by etching. Then the insulating layer 37 made of polyimide, epoxy or the like is formed and holes are formed therein using a light-sensitive resin or dry etching method, and then the wiring layer 36 is formed by sputtering, plating or the like. These steps are repeated to form a multi-layered laminated wiring layer 34. By selecting a metal material having good dimensional stability for the core frame 43, the dimensional precision of the laminated wiring layer 34 is improved. Also, the bonding strength between the resin layer 44 and the external electrode pads 39 and between the resin layer 44 and the insulating layer 37 is adjusted by means of the surface roughness of the copper foil to be laminated and the hardness of the resin layer 44 so that it is smaller than the contacting strength between the core frame 43 and the resin layer 44.

Then, the semiconductor element 31 is mounted on the laminated wiring layer 34 to which the core frame 43 is attached. In this embodiment, mounting is achieved by the flip-chip method. The projection electrodes 32 of the semiconductor element 31 may be solder balls or gold bumps coated with solder. The projection electrodes 32 are located on the internal electrode pads 33 and heated for bonding. At this time, the solder resist 42 serves as a solder dam for preventing the solder from spreading to an undesired region. Instead of providing the projection electrodes 32 on the semiconductor element 31, the solder balls may be disposed on the internal electrode pads 35. Also, by selecting a material having a coefficient of thermal expansion match to the core frame 43, the reliability of the projection electrode bonding can be improved.

In the next step, the semiconductor element 31 is encapsulated by the mold resin 41 to protect the semiconductor element 31 and provide the mold resin with a predetermined configuration and a rigid package. As for the molding method, transfer molding in which the outer shape can be clearly defined by dies is suitable.

Figure 21A:
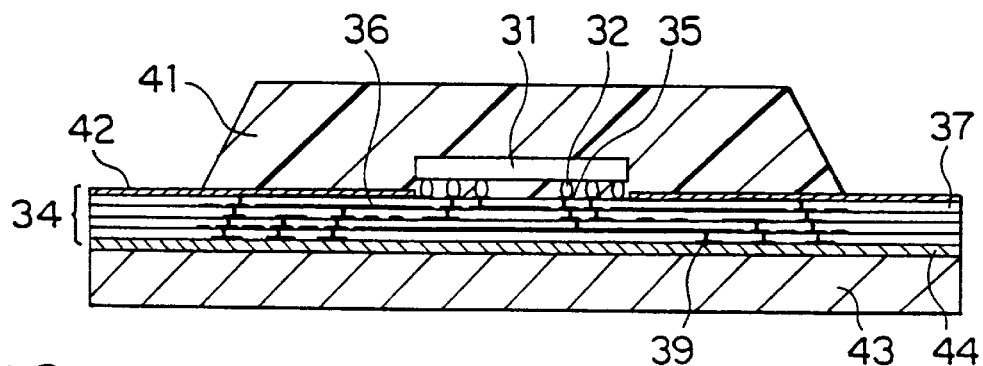
FIGS. 21a to 21d are sectional views showing the manufacturing method of the semiconductor device of a seventeenth (17th) embodiment of the present invention.
Figure 21B:
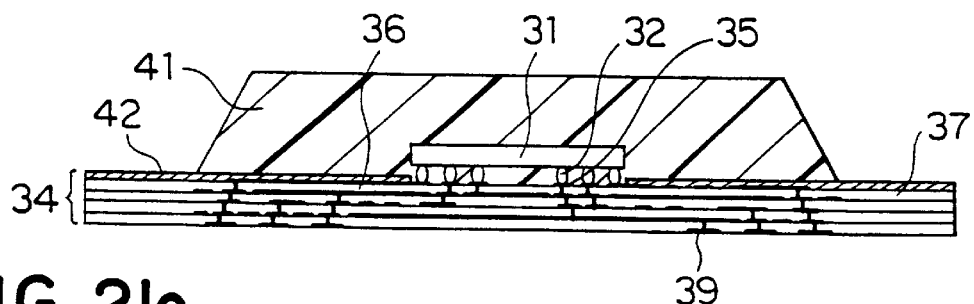

In the next step, the laminated wiring layer 34 and the core frame 43 are separated from each other. FIG. 21b illustrates the separated state. In this separating step, the separation of the two components can be easily made because the attachment at the interface between the resin layer 44 and the laminated wiring layer 34 is made weak in the previous step of forming the laminated wiring layer 34 on the core frame 43.

Figure 21C:
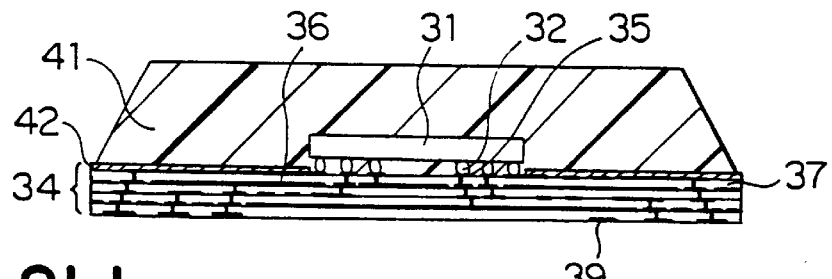
Figure 21D:
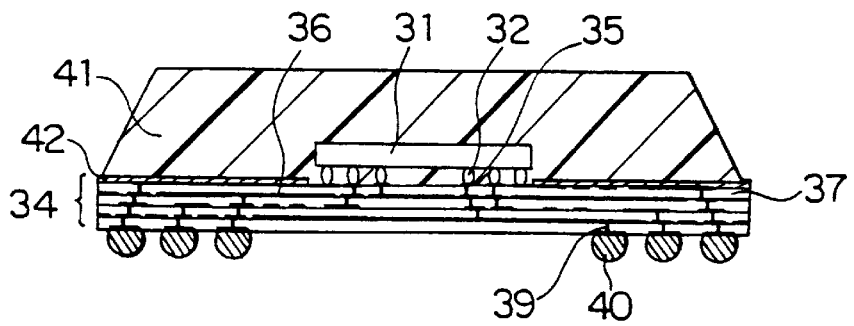

In the next step, as shown in FIG. 21c, the laminated wiring layer 34 is cut so that the package has a prescribed size. The cutting is achieved with a die or by dicing. As the last step, as shown in FIG. 21d, the solder balls 40 are attached to the external electrode pads 39. This step may be carried out prior to the cutting step. While the description has been made in conjunction with an example in which a single semiconductor device is manufactured in this embodiment, a plurality of semiconductor devices may be successively produced on a core frame in the shape of an elongated card or a wound tape. Also, while the semiconductor element 31 is mounted using the flip-chip method in this embodiment, the wire-bonding method or TAB method may equally be used.

Embodiment 18

FIGS. 22a, 22b, 22c and 22d are sectional views illustrating the steps for manufacturing a semiconductor device of an embodiment 18 of the present invention. In these figures, the reference numeral 31 is the semiconductor element, 32 are the projection electrodes, 34 is the laminated wiring layer, 35 are the internal electrode pads on the surface layer of the laminated wiring layer 34, the internal electrode pads 35 being connected to the projection electrodes 32. The reference numeral 36 is the wiring within the laminated wiring layer 34, 37 is the insulating layer of the laminated wiring layer 34, 39 are the external electrode pads, 40 are the solder balls attached to the external electrode pads 39, 42 is a solder resist covering the wiring on the surface layer so as to expose the internal electrode pads 35, 43 is a core frame made of copper or stainless steel, 44 is a resin layer provisionally bonding the laminated wiring layer 34 to the core frame 43, 45 is a frame for additionally providing the package main body with mechanical strength, 46 is a bonding agent bonding the frame 45 to the laminated wiring layer 34 and 47 is a mold resin encapsulating and protecting the semiconductor element 31.

The manufacture of this embodiment will now be described. In conjunction with FIG. 22a, the step of forming the laminated wiring layer 34 on the core frame 43 will be described. After the thermoplastic or thermosetting resin layer 44 is applied on the core frame 43, a copper foil is placed on it and the external electrode pads 39 are formed by etching. Then, the insulating layer 37 made of polyimide, epoxy or the like is formed and, after holes are formed therein using a light sensitive resin or by dry etching, the wiring layer 36 made of copper or aluminum formed by evaporation, sputtering, plating or the like is formed. This is repeated until a multi-layered laminated wiring layer 34 is formed. The bonding strength between the resin layer 44 and the external electrode pads 39 and between the resin layer 44 and the insulating layer 37 is adjusted by means of the surface roughness of the copper foil to be laminated and the hardness of the resin layer 44 so that it is smaller than the contacting strength between the core frame 43 and the resin layer 44.

Then, the semiconductor element 31 is mounted on the laminated wiring layer 34 to which the core frame 43 is attached. In this embodiment, mounting is achieved by the flip-chip method. The projection electrodes 32 of the semiconductor element 31 may be solder balls or gold bumps coated with solder. The projection electrodes 32 are located on the internal electrode pads 33 and heated for bonding. At this time, the solder resist 42 serves as a solder dam for preventing the solder from spreading to an undesired region. Instead of providing the projection electrodes 32 on the semiconductor element 31, the solder balls may be disposed on the internal electrode pads 35. Also, by selecting a material having a coefficient of thermal expansion as the material for the core frame 43, the reliability of the projection electrode bonding can be improved.

In the next step, the semiconductor element 31 is encapsulated by the mold resin 41 to protect the semiconductor element 31 and provide the mold resin with a predetermined configuration and a rigid package. As for the molding method, transfer molding in which the outer shape can be clearly defined by dies is suitable.

Figure 22A:
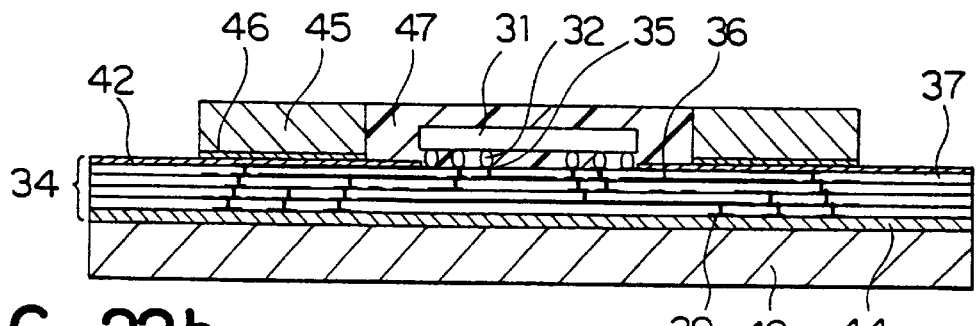
FIGS. 22a to 22d are sectional views showing the manufacturing method of the semiconductor device of an eighteenth (18th) embodiment of the present invention.
Figure 22B:
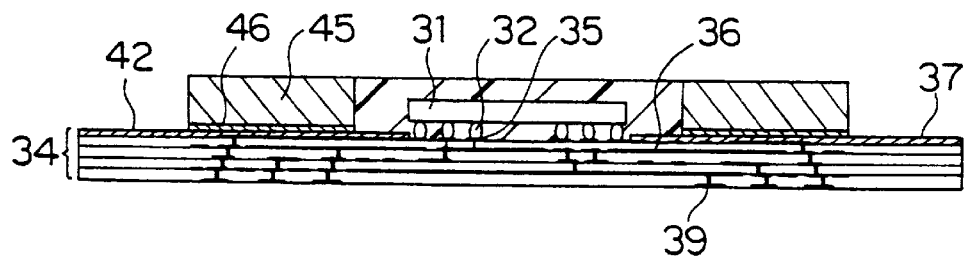

In the next step, the laminated wiring layer 34 and the core frame 43 are separated from each other. FIG. 22b illustrates the separated state. In this separating step, the separation of the two components can be easily made because the attachment at the interface between the resin layer 44 and the laminated wiring layer 34 is made weak in the previous step of forming the laminated wiring layer 34 on the core frame 43.

Figure 22C:
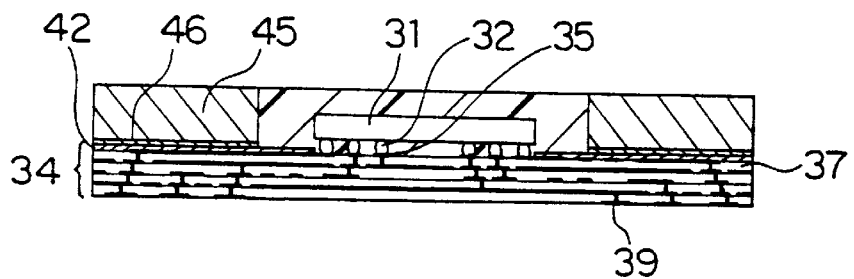
Figure 22D:
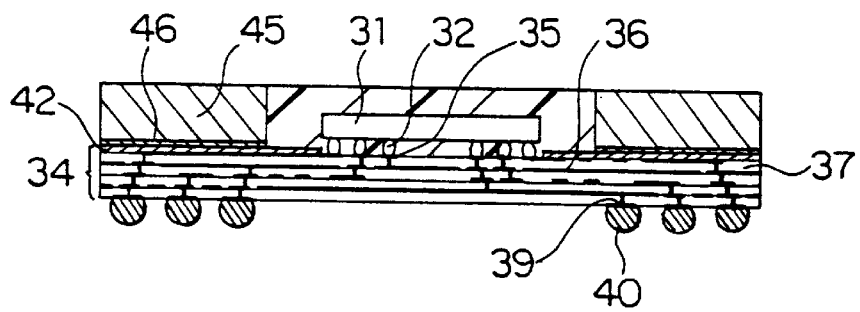

In the next step, as shown in FIG. 22c, the laminated wiring layer 34 is cut so that the package has a prescribed size. The cutting is achieved with a die or by dicing. As the last step, as shown in FIG. 22d, the solder balls 40 are attached to the external electrode pads 39. This step may be carried out prior to the cutting step.

While the description has been made in conjunction with an example in which a single semiconductor device is manufactured in this embodiment, a plurality of semiconductor devices may be successively produced on a core frame in the shape of an elongated card or a wound tape. Also, while the semiconductor element 31 is mounted in the flip-chip method in this embodiment, the wire-bonding method or TAB method may equally be used. Also, the frame 45 used in this embodiment may also be employed in the manufacturing method for the semiconductor device having the lead pattern 7 as in embodiment 1 and without the multi-layered laminated wiring layer as in this embodiment.

Embodiment 19

Figure 23:
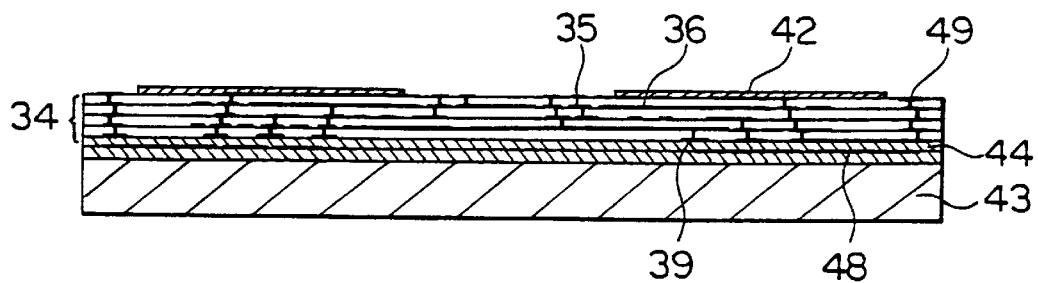
FIG. 23 is a sectional view showing the frame material used in the manufacture of the semiconductor device of a nineteenth (19th) embodiment of the present invention.

FIG. 23 is a sectional view of the laminated wiring layer with core frame for use in a method for manufacturing a package of a semiconductor device of an embodiment 19 of the present invention. In FIG. 23, the reference numerals 34 to 37, 39, 42 and 43 are the same components as those of embodiments 12 to 18. In this embodiment, a lead wiring 48 is provided within the resin layer 44 to electrically connect the external electrode pads 39 and the test electrodes 49.

In this embodiment, by electrically connecting the external electrode pads 39 to the test electrodes 49 and checking between the internal electrode pads 35 and the test electrodes 49, it is possible to determine whether "the wiring between the internal electrode pads 35 to the external electrode pads 39 are normal or not". Therefore, the laminated wiring layer 34 can be determined if it is good or poor before mounting the semiconductor element on it, so that the waste of good semiconductor element by mounting it on a poor substrate can be prevented. Also, after the semiconductor element is mounted, the test of the semiconductor element and the electrical connection can be achieved through the test electrodes 49, so that the poor element can be replaced with a good semiconductor element. In this example, since the layer of the lead wiring 48 and the layer of the external electrode pads 39 are separate layers, the lead wiring is not an obstacle even with a package having a large number of electrodes.

Embodiment 20

Figure 24:
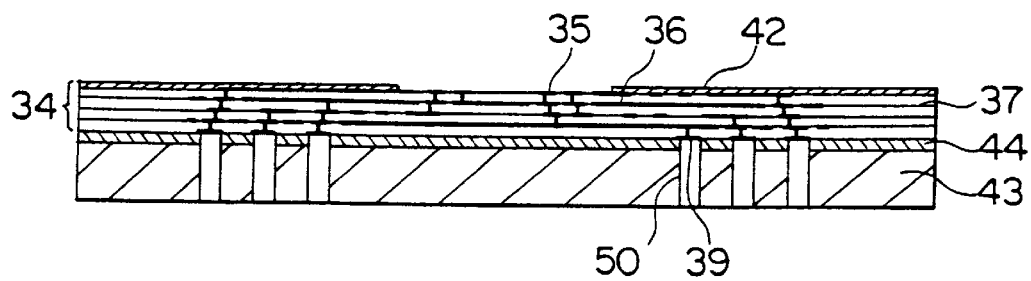
FIG. 24 is a sectional view showing the frame material used in the manufacture of a semiconductor device of a twentieth (20th) embodiment of the present invention.

FIG. 24 is a sectional view of the laminated wiring layer with a core frame for use in a method for manufacturing a package of a semiconductor device of an embodiment 20 of the present invention. In the figure, the reference numerals 34 to 37, 39 and 42 are the same components as those of embodiments 12 to 19. In this embodiment, the core frame 43 and the resin layer 44 has contact holes 50 at corresponding positions immediately below the external electrode pads 39.

In this embodiment, the contact holes 50 are provided in the core frame 43 and the resin layer 44 at corresponding positions immediately below the external electrode pads 39 in order that a test probe can be brought into contact with the external electrode pads 39. Therefore, with this embodiment, by applying the test probe to the internal electrode pads 35 and the external electrode pads 39 for checking, whether "the wiring between the internal electrode pads 35 to the external electrode pads 39 is normal or not" can be determined.

Therefore, in this embodiment, the laminated wiring layer 34 can be determined to be good or poor before mounting the semiconductor element on it, so that the waste of good semiconductor element by mounting it on a poor substrate can be prevented. Also, after the semiconductor element is mounted, a test of the semiconductor element and the electrical connection can be achieved through the external electrode pads 39, so that a poor element can be replaced with a good semiconductor element. Also, in this embodiment, the test probe can be brought into direct contact with the external electrode pads 39 without the need for the lead wiring, so that a poor connection in the lead wiring between the external electrode pads 39 and the test electrodes is not involved in the test, resulting in a more accurate test. Also, the contact holes of this embodiment can be applied not only to the multi-layered laminated wiring layer of this embodiment, but also to the semiconductor device having the lead pattern 7 as that of embodiment 1.

Embodiment 21

Figure 25:
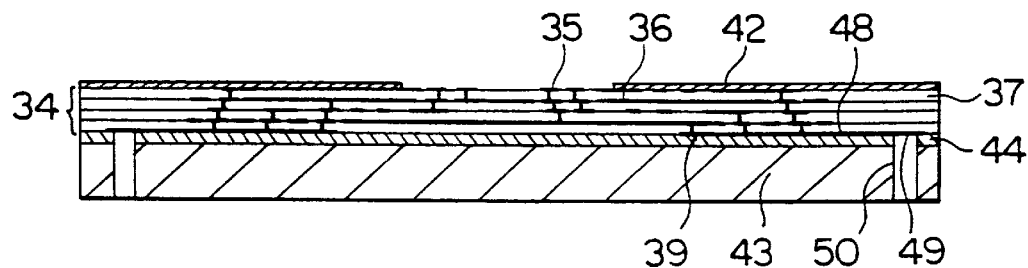
FIG. 25 is a sectional view showing the frame material used in the manufacture of the semiconductor device of a twenty-first (21th) embodiment of the present invention.
Figure 26A:
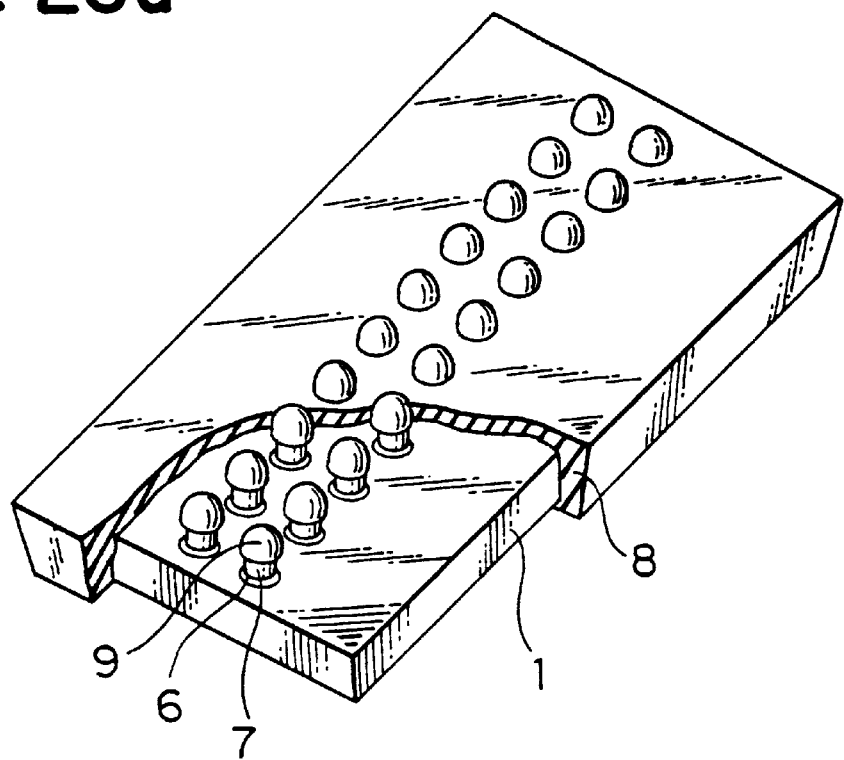
FIG. 26a is a perspective view of a conventional semiconductor device.
Figure 26B:
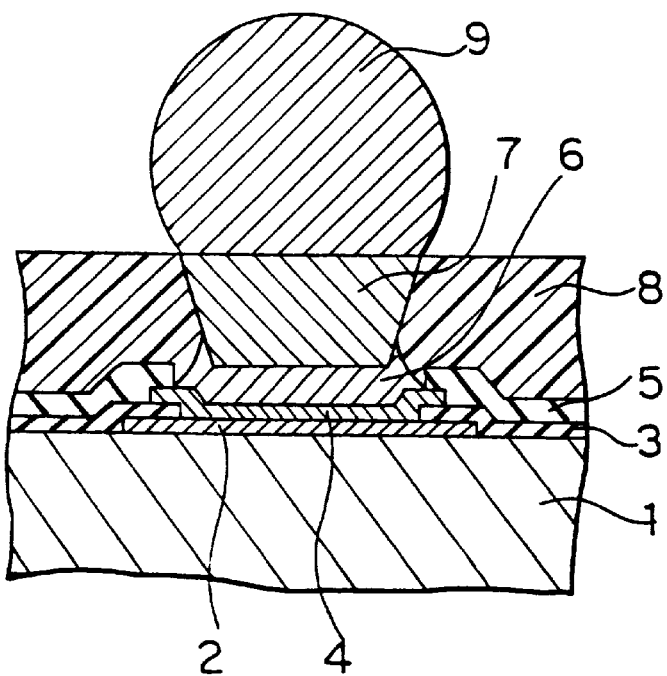
Figure 27A:
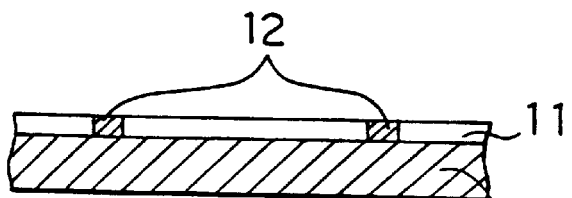
FIGS. 27a to 27e are views illustrating a manufacturing steps of the conventional semiconductor device.
Figure 27B:
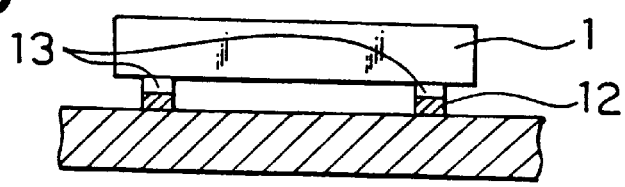
Figure 27C:
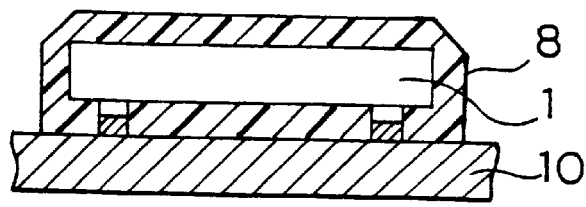
Figure 27D:
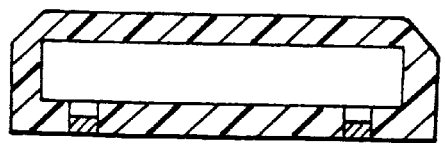
Figure 27E:
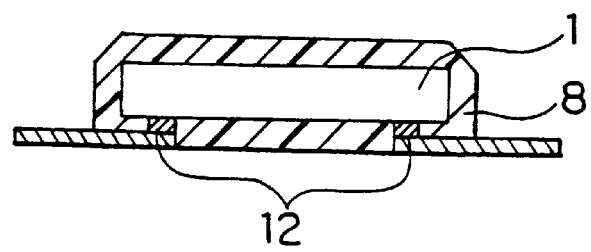
Figure 28:
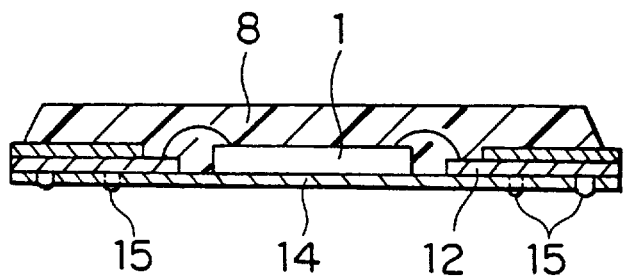
FIG. 28 is a sectional view illustrating a conventional semiconductor device.
Figure 29:
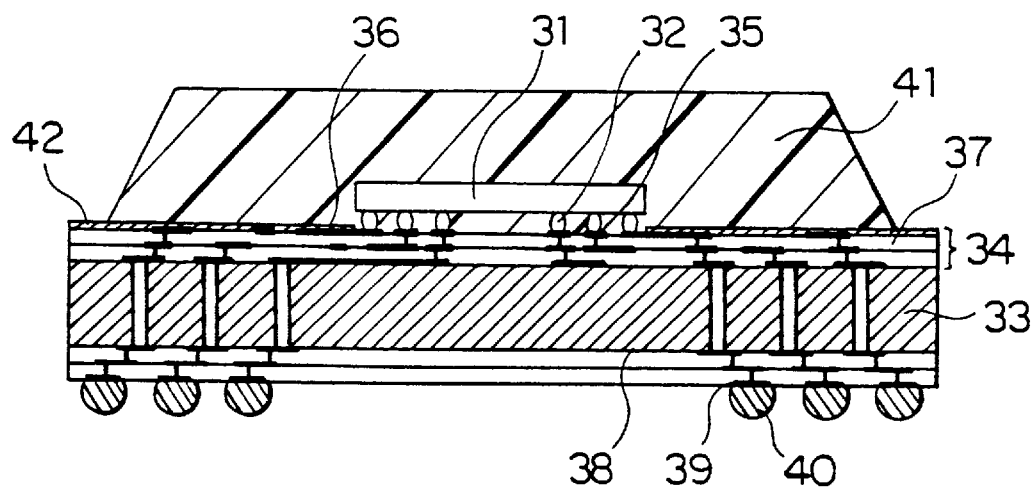
FIG. 29 is a sectional view illustrating a conventional semiconductor device.
Figure 30:
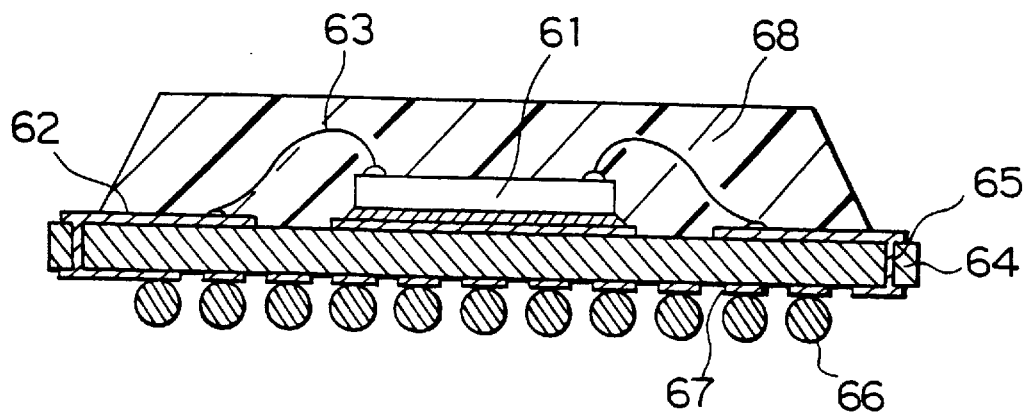
FIG. 30 is a sectional view illustrating a conventional semiconductor device.

FIG. 25 is a sectional view of the laminated wiring layer having the core frame for use in a method for manufacturing a package of a semiconductor device of an embodiment 21 of the present invention. In FIG. 25, the reference numerals 34 to 37, 39 and 42 are components similar to those of embodiments 12 to 20. In this embodiment, the lead wiring 48 is extended to the outer periphery of the package and is connected to the test electrodes 49. The contact frame 43 and the resin layer 44 have formed therein contact holes 50 at corresponding positions immediately below the test electrodes 49. A test probe can be brought into contact with the internal electrode pads 35 and the test electrodes 49 through these contact holes 50 to check whether the wiring up to the internal electrode pads 35 and the external electrode pads 39 are normal or not.

Therefore, in this embodiment, the laminated wiring layer can be determined as to its quality before mounting the semiconductor element on it, so that the waste of good semiconductor element by mounting it on a poor substrate can be prevented. Also, after the semiconductor element is mounted, tests of the semiconductor element and the electrical connection can be achieved through the test electrodes 49, so that a poor element can be replaced with a good semiconductor element. In embodiment 20, since the external electrode pads 39 are exposed to the outside, they must be gold plated in order to prevent oxidization during the heating in manufacturing process which impedes wettability of the solder in the attachment of the solder balls. However, in this embodiment, the external electrode pads 39 are not exposed to the ambient until the solder balls are attached, so that the plating is not required. Also, the contact holes of this embodiment can be applied not only to the multi-layered laminated wiring layer of this embodiment, but also to the semiconductor device having the lead pattern 7 as in embodiment 1.

As has been described, according to the present invention, the semiconductor device comprises a lead pattern transferred on the lower surface of the encapsulating resin, so that the semiconductor device can be made thin and, since no through hole is provided, the problem of leakage is eliminated and reliability is improved. Also, since a plurality of external electrodes are formed on the bottom surface of the lead pattern, multi-pin type device can be realized.

Also the semiconductor device of the present invention comprises a plurality of laminated wiring layers transferred on the lower surface of the encapsulating resin, so that the semiconductor device can be made thin and, since no through hole is provided, the problem of leakage is eliminated and reliability is improved. Also, since a plurality of external electrodes are disposed on the lower surface of the laminated wiring layer, multi-pin type device can be realized.

Also according to the semiconductor device of the present invention, a lead pattern composed of a lead frame is secured to the lower surface of the encapsulating resin, the manufacture of the device is easy and the cost can be decreased, and the semiconductor device can be made thin and the reliability can be improved.

According to the method for manufacturing a semiconductor device of the present invention, a lead pattern is formed on a transferring substrate, resin encapsulating an upper portion of the transferring substrate to cover the semiconductor substrate, and the transferring substrate is removed, so that the lead pattern is formed on the bottom surface of the encapsulating resin and a large number of electrodes can be formed. Therefore, the semiconductor device can be made multi-pin type and at the same time the device can be made thin and reliability can be improved.

Also in the method for manufacturing a semiconductor device of the present invention, a laminated wiring layer is formed on a transferring substrate, an upper portion of the transferring substrate is resin encapsulated to cover the semiconductor substrate, and the transferring substrate is removed , so that the laminated wiring layer is formed on the lower surface of the encapsulating resin and a large number of external electrodes can be formed on the laminated wiring layer. Therefore, the semiconductor device can be made multi-pin type and at the same time the device can be made thin and reliability can be improved.

According to the method for manufacturing a semiconductor device of the present invention, encapsulating an upper portion of the lead frame is encapsulated with resin to cover the semiconductor chip, and a plurality of external electrodes are formed on a lower surface of the lead frame, so that the thin, highly reliable semiconductor device can be manufactured at a low cost without need for making a substantial change to the conventional method for manufacturing the semiconductor device.

In the method for manufacturing a semiconductor device of the present invention, the lead pattern is formed on the thermosetting resin layer of the transferring substrate, so that the lead pattern can be easily transferred.

According to the method for manufacturing a semiconductor device of the present invention, the thermosetting resin layer is laminated on a frame substrate with a thermoplastic resin layer interposed therebetween, so that the thermosetting resin layer and the frame substrate do not separate from each other, further improving the transferring ability of the lead pattern.

According to the semiconductor device of the present invention, a bonding layer for bonding the semiconductor substrate and the lead pattern is disposed between the semiconductor substrate and the lead pattern composed of the lead frame, so that the lead frame may be used as the lead pattern even when the wire-bonding cannot be used.

According to the semiconductor device of the present invention, the lower surfaces of the encapsulating resin and the lead pattern are coated with a resin, so that the positions of the external electrodes can be controlled and the flow of the solder from the external electrodes can be prevented and that the lead pattern is protected by the resin coating.

According to the semiconductor device of the present invention, the lower surface of the encapsulating resin and the lead pattern is covered with an encapsulating resin, so that the positions of the external electrodes can be controlled and the flow of the solder from the external electrodes can be prevented and that the lead pattern is protected by the encapsulating resin.

According to the semiconductor device of the present invention, the reverse side of the semiconductor substrate is exposed from the encapsulating resin, so that the heat dissipation of the semiconductor device is improved.

According to the semiconductor device of the present invention, a heat dissipating fin or a heat dissipating plate is disposed at the exposed reverse side of the semiconductor substrate, so that the heat dissipation of the semiconductor device is improved.

According to the semiconductor device of the present invention, the lead pattern is extended to the externally of the encapsulating resin to define a test pad, so that the test burn-in can be achieved prior to the resin encapsulation.

According to the semiconductor device of the present invention, the encapsulating resin has embedded therein a plurality of semiconductor substrates or electronic components, so that the semiconductor device can be made much more high-density mounted.

According to the semiconductor device of the present invention, the lead pattern has formed on its region other than the bonding region, on which the bonding layer for connecting the lead pattern and the external electrode or the semiconductor substrate, a protective layer made of an electrically insulating material, so that the flow of the solder of the bonding layer can be prevented and the configuration and the height of the bonding layer can be controlled.

According to the semiconductor device of the present invention, the lead pattern has formed on its bonding region, on which the bonding layer for connecting the lead pattern and the external electrode or the semiconductor substrate is formed, a plated layer, so that the diffusion of the bonding layer can be prevented and the configuration and the height of the bonding layer can be controlled.

According to the semiconductor device of the present invention, the semiconductor substrate has formed thereon a substrate metal layer for electrically connecting the bonding pad and the external electrode or the lead pattern, so that the size of the bonding pads can be made small, realizing a much smaller semiconductor device.

According to the semiconductor device of the present invention, the lead pattern has bonded thereon a frame for providing the package with a rigidity, so that the rigidity of the package is increased. Also, by making the frame with a material having a coefficient of thermal expansion close to that of the mounting substrate to which the package is mounted, the reliability of the mounting can be increased.

According to the semiconductor device of the present invention, the plurality of laminated wiring layers have bonded thereon a frame for providing the package with a rigidity, so that the rigidity of the package is increased. Also, by making the frame with a material having a coefficient of thermal expansion close to that of the mounting substrate to which the package is mounted, the reliability of the mounting can be increased.

According to the method for manufacturing a semiconductor device of the present invention, a frame surrounding the semiconductor substrate is bonded to the lead pattern after the lead patter is bonded to the semiconductor substrate, so that the rigidity of the package is increased by the frame. Also, by making the frame with a material having a coefficient of thermal expansion close to that of the mounting substrate to which the package is mounted, the reliability of the mounting can be increased.

According to the method for manufacturing a semiconductor device of the present invention, a frame surrounding the semiconductor substrate is bonded to the laminated wiring layer after the laminated wiring layer is bonded to the semiconductor substrate, so that the rigidity of the package is increased by the frame. Also, by making the frame with a material having a coefficient of thermal expansion close to that of the mounting substrate to which the package is mounted, the reliability of the mounting can be increased.

According to the method for manufacturing a semiconductor device of the present invention, the transferring substrate has formed therein a hole for a contact at a location under the external electrode pad, so that the wiring test between the external electrode pad and the internal electrode pad can be made easy.

According to the method for manufacturing a semiconductor device, the transferring substrate has formed therein a hole for a contact at a location under the testing electrode pad electrically connected to an internal electrode pad, so that the wiring test between the test electrode pad and the internal electrode pad can be made easy.

What is claimed is:

1. A method for manufacturing a semiconductor device comprising:

forming a lead pattern on an upper surface of a transferring substrate;

bonding a semiconductor substrate to the upper surface of said transferring substrate in contact with the lead pattern;

encapsulating said semiconductor substrate with a resin, the resin covering a part of the upper surface of said transferring substrate;

removing said transferring substrate, leaving said lead pattern bonded to said resin and to said semiconductor substrate.

2. A method for manufacturing a semiconductor device comprising:

forming a plurality of laminated wiring layers on an upper surface of a transferring substrate;

bonding a semiconductor substrate to the upper surface of said transferring substrate in contact with the laminated wiring layers;

encapsulating said semiconductor substrate with a resin, a part of the resin covering the upper surface of said transferring substrate; and removing said transferring substrate, leaving said laminated wiring layers bonded to said resin and to said semiconductor substrate.

3. A method for manufacturing a semiconductor device comprising:

die-bonding and connecting a semiconductor chip to an upper surface of a lead frame;

encapsulating said semiconductor chip with a resin, the resin covering a part of the upper surface, but not a lower surface, of said lead frame; and forming a plurality of external electrodes on the lower surface of said lead frame.

4. The method for manufacturing a semiconductor device as claimed in claim 1, wherein said transferring substrate includes a thermosetting resin layer and said lead pattern is formed on said thermosetting resin layer.

5. A method for manufacturing a semiconductor device comprising:

forming a lead pattern on an upper surface of a transferring substrate;

bonding a semiconductor substrate to the upper surface of said transferring substrate in contact with the lead pattern;

bonding a frame surrounding said semiconductor substrate to said lead pattern;

encapsulating said semiconductor substrate with a resin, the resin covering a part of the upper surface of said transferring substrate; and removing said transferring substrate, leaving said lead pattern bonded to said resin and to said semiconductor substrate.

6. A method for manufacturing a semiconductor device comprising:

forming a plurality of laminated wiring layers on an upper surface of a transferring substrate;

bonding a semiconductor substrate to the upper surface of said transferring substrate in contact with the laminated wiring layers;

bonding a frame surrounding said semiconductor substrate to said laminated wiring layers;

encapsulating said semiconductor substrate with a resin, the resin covering a part of the upper surface of said transferring substrate; and removing said transferring substrate, leaving said laminated wiring layers bonded to said resin and to said semiconductor substrate.

7. The method for manufacturing a semiconductor chip as claimed in claim 1 wherein said transferring substrate comprises a metal substrate, a thermoplastic resin disposed on said metal substrate, a thermosetting resin disposed on said thermoplastic resin and wherein said lead pattern is disposed on said thermosetting resin.

8. The method for manufacturing a semiconductor chip as claimed in claim 5 wherein said transferring substrate comprises a metal substrate, a thermoplastic resin disposed on said metal substrate, a thermosetting resin disposed on said thermoplastic resin and wherein said lead pattern is disposed on said thermosetting resin.

* * * * *